United States Patent
Tsai et al.

(10) Patent No.: US 6,865,764 B2
(45) Date of Patent: Mar. 15, 2005

(54) FIXTURE FOR ASSEMBLING A POST-CMP CLEANING BRUSH

(75) Inventors: Ming Fa Tsai, Panchiao (TW); Chia Chi Lin, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 390 days.

(21) Appl. No.: 10/124,141

(22) Filed: Apr. 16, 2002

(65) Prior Publication Data

US 2003/0085609 A1 May 8, 2003

(30) Foreign Application Priority Data

Nov. 8, 2001 (TW) ........................................ 90127795 A

(51) Int. Cl.⁷ .............................................. A47L 25/00
(52) U.S. Cl. .................... 15/77; 15/1; 15/88.3; 29/234; 29/235; 29/895.23; 300/1; 300/21
(58) Field of Search .............................. 15/21.1, 77, 1, 15/88.3; 300/19, 21, 2, 1; 29/451, 234, 895.23, 235, 450; 269/48.1, 48.2

(56) References Cited

U.S. PATENT DOCUMENTS 6,363,594 B1 * 4/2002 Jahani et al. .................. 29/235

* cited by examiner

Primary Examiner—Jennifer McNeil
Assistant Examiner—Abraham Bahta
(74) Attorney, Agent, or Firm—Ladas & Parry LLP

(57) ABSTRACT

A fixture for assembling a post-CMP cleaning brush. The post-CMP cleaning brush is provided with a brush core and an outer brush, and the outer brush is provided with a hollow portion. The fixture comprises a base, a plurality of posts and a guiding member. The base is provided with a plurality of holes. The posts insert into the holes of the base through the hollow portion of the outer brush respectively so as to assist the brush core in passing through the hollow portion of the outer brush. The guiding member is connected with the brush core to assist the brush core in passing through the hollow portion of the outer brush.

12 Claims, 6 Drawing Sheets

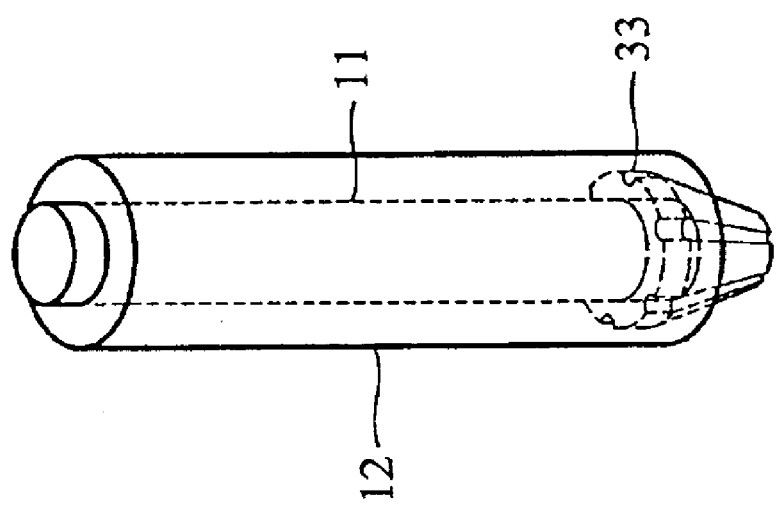

FIXTURE FOR ASSEMBLING A POST-CMP CLEANING BRUSH

BACKGROUND OF THE INVENTION

1. Field of the Invention

The invention relates to a fixture for assembling a post-CMP cleaning brush; in particular, to a fixture that assists in the assembly of the post-CMP cleaning brush.

2. Description of the Related Art

As is well known, semiconductor devices are fabricated from semiconductor wafers, which are subjected to numerous processing operations. These operations include, for example, impurity implants, gate oxide generation, intermetal oxide depositions, metallization depositions, photolithography pattering, etching operations, chemical mechanical polishing (CMP), etc. Although these processes are performed in ultra clean environments, the very nature of many of the process operations is to blame for the generation of surface particles and residue. For instance, when CMP operations are performed, a film of particles and/or metal contaminants are commonly left behind.

Because surface particles can detrimentally impact the performance of an integrated circuit device, wafer cleaning operations have become a standard procedural requirement after certain process steps. Although cleaning operations are rather procedural, the equipment and chemicals implemented to perform the actual cleaning are highly specialized. This specialization is important because each wafer, being at different stages of fabrication, represents a significant investment in terms of raw materials, equipment fabrication time, and associated research and development.

To perform the cleaning operations in an automated manner, fabrication labs employ cleaning systems. The cleaning systems typically include one or more brush boxes in which wafers 1 are scrubbed. As shown in FIG. 1a, each brush box includes a pair of brushes 10, such that each brush 10 scrubs a respective side of a wafer 1. To enhance the cleaning ability of such brush boxes, it is common practice to deliver cleaning fluids through the brush 10 (TTB). Referring to FIG. 1b, TTB fluid delivery is accomplished by implementing brush cores 11 that have a plurality of holes that allow fluids to be fed into the brush core 11 at a particular pressure to be released into an outer brush 12 surface. The outer brush 12 surface is made out of a very porous and soft material so that direct contact with the delicate surface of a wafer 1 does not cause scratches or other damage. Typically, the outer brush 12 surface is made out of polyvinyl alcohol (PVA) foam. Although, other materials such as nylon, mohair or a mandrel wrapped with a polishing pad material can be used. It is noted that the outer brush 12 is provided with a hollow portion 121 for the brush core 11 passing through.

The outer brush 12 must be replaced after cleaning a predetermined number of wafers 1. The conventional method for assembling a new outer brush 12 and the brush core 11 is shown in FIG. 2a, FIG. 2b, FIG. 2c, and FIG. 2d. Firstly, two pads 20, shown in FIG. 2a and made of PVC, are passed through the hollow portion 121 of the outer brush 12 as shown in FIG. 2b. Then, the hollow portion 121 of the outer brush 12 is expanded by pulling the pads 20 while the brush core 11 is passed through the hollow portion 121 of the outer brush 12 as shown in FIG. 2c. Finally, the pads 20 are drawn out of the hollow portion 121 of the outer brush 12 to complete the assembly of the post-CMP cleaning brush 10.

The conventional assembly method has the following disadvantages:

1. Since it is difficult to actually expand the pads 20 into the hollow portion 121 of the outer brush 12, it is difficult to pass the brush core 11 through the hollow portion 121 of the outer brush 12.

2. Since it is difficult to smoothly pass the brush core 11 through the hollow portion 121 of the outer brush 12, the outer brush 12 is easily damaged when the brush core 11 passes through the hollow portion 121 of the outer brush 12.

3. Since the material of the pads 20 is the same as the outer brush 12, it is difficult to draw the pads 20 out of the hollow portion 121 of the outer brush 12. Thus, the pads 20 are easily damaged.

SUMMARY OF THE INVENTION

In order to address the disadvantages of the aforementioned assembly method for a post-CMP cleaning brush, the invention provides a fixture that assists in the assembly of the post-CMP cleaning brush.

Another purpose of this invention is to provide a method for assembling a post-CMP cleaning brush without damaging its outer brush.

Accordingly, the invention provides a fixture for assembling a post-CMP cleaning brush having a brush core and an outer brush. The outer brush is provided with a hollow portion, and the fixture comprises a base and a plurality of posts. The base is provided with a plurality of holes. The posts insert into the holes of the base through the hollow portion of the outer brush respectively so as to assist the brush core to pass through the hollow portion of the outer brush.

In a preferred embodiment, the fixture further comprises a guiding member, connecting with the brush core, to make it easier for the brush core to pass through the hollow portion of the outer brush.

Furthermore, the guiding member is provided with a plurality of grooves corresponding to the posts respectively. Thus, the guiding member slides along the posts by the grooves when the guiding member, connecting with the brush core, passes through the hollow portion of the outer brush.

Furthermore, the guiding member is provided with a threaded portion for connecting with the brush core.

In another preferred embodiment, each of the posts is provided with a bending portion, and the base is provided with a concave portion.

In another preferred embodiment, this invention provides a method for assembling a post-CMP cleaning brush. The method comprises the following steps:

(a) providing a post-CMP cleaning brush having a brush core and an outer brush, wherein the outer brush is provided with a hollow portion;

(b) providing a base, a plurality of posts and a guiding member;

(c) passing the posts through the hollow portion of the outer brush;

(d) disposing the posts, passing through the hollow portion of the outer brush, on the base;

(e) connecting the guiding member and the brush core;

(f) passing the brush core, connecting with the guiding member, through the hollow portion of the outer brush in a manner such that the brush core is adjacent to the posts after the guiding member enters into the hollow portion of the outer brush; and (g) drawing the posts from the hollow portion of the outer brush so that the brush core is adjacent to the outer brush to complete the assembly of the post-CMP cleaning brush.

Furthermore, the posts are made of plastic steel.

BRIEF DESCRIPTION OF THE DRAWINGS

The invention is hereinafter described in detail with reference to the accompanying drawings in which:

FIG. 4a, FIG. 4b, FIG. 4c, FIG. 4d, FIG. 4e, FIG. 4f and FIG. 4g are schematic views of a method for assembling a post-CMP cleaning brush as disclosed in this invention.

DETAILED DESCRIPTION OF THE INVENTION

Figure 1A:
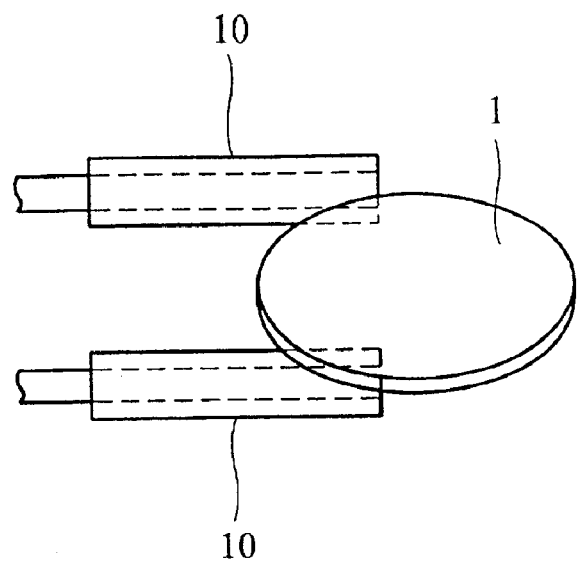
FIG. 1a is a schematic view of a cleaning system.
Figure 1B:
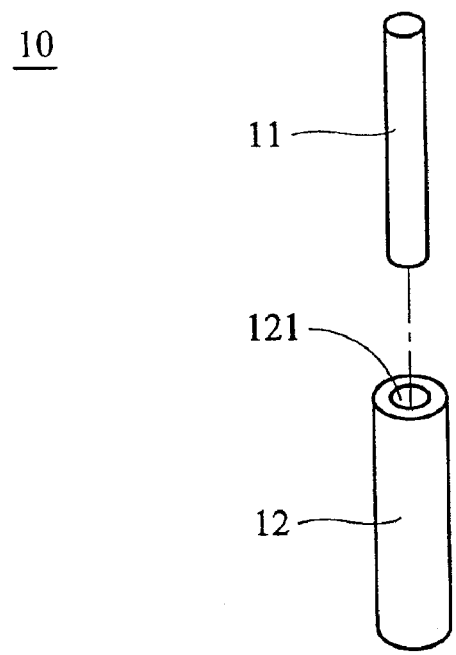
FIG. 1b is a schematic view of a post-CMP cleaning brush.
Figure 2A:
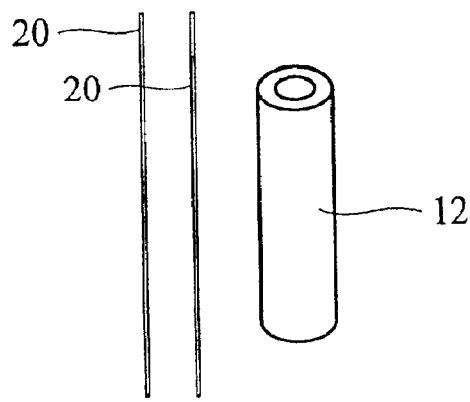
FIG. 2a, FIG. 2b, FIG. 2c and FIG. 2d are schematic views of a conventional method for assembling the post-CMP cleaning brush as shown in FIG. 1b.
Figure 2B:
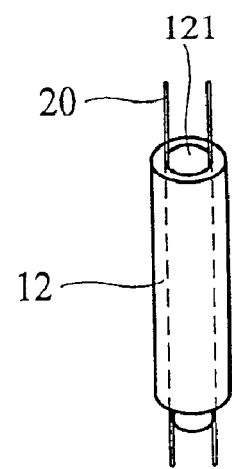
Figure 2C:
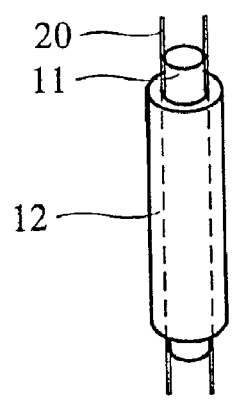
Figure 2D:
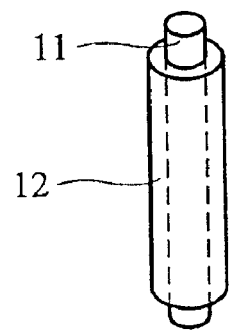
Figure 3:
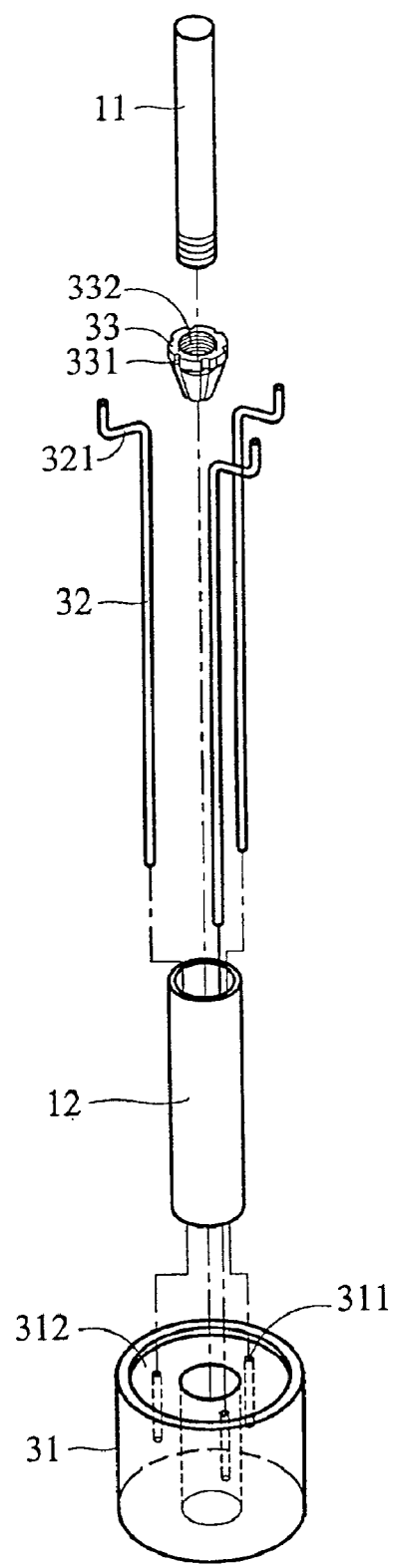
FIG. 3 is a schematic view that shows an assembly fixture as disclosed in this invention.

Referring to FIG. 3, a fixture 30 as disclosed in this invention is applied for a post-CMP cleaning brush 10 as shown in FIG. 1b. The post-CMP cleaning brush 10 is provided with a brush core 11 and an outer brush 12, and the outer brush 12 is provided with a hollow portion 121.

The fixture 30 comprises a base 31, three posts 32, and a guiding member 33. The base 31 is provided with three holes 311 and a concave portion 312. The holes 311 accept the posts 32, and the concave portion accepts the brush 10 disposed thereon.

The posts 32 can pass through the hollow portion 121 of the outer brush 12, and enter into the holes 311 of the base 31 respectively. The posts 32, passing through the hollow portion 121 of the outer brush 12, can be used to expand the hollow portion 121 of the outer brush 12. Thus, the brush core 11 can easily be passed through the hollow portion 121 of the outer brush 12. Furthermore, each of the posts 32 is provided with a bending portion 321 at one end so as to expand the hollow portion 121 of the outer brush 12 more easily.

The guiding member 33 is provided with three grooves 331 around its circumference, and is provided with a threaded portion 332. The guiding member 33 is connected with the brush core 11 through the threaded portion 332, and the grooves 331 correspond to the posts 32 respectively. Thus, when the guiding member 33, connecting with the brush core 11, passes through the hollow portion 121 of the outer brush 12, the guiding member 33 slides along the posts 32 by the grooves 331. As a result, the guiding member 33 can assist the brush core 11 to pass through the hollow portion 121 of the outer brush 12 more smoothly.

The structure of the fixture 30 is described as above, and a post-CMP cleaning brush assembly method, as disclosed in this invention, is described as follows.

Figure 4C:
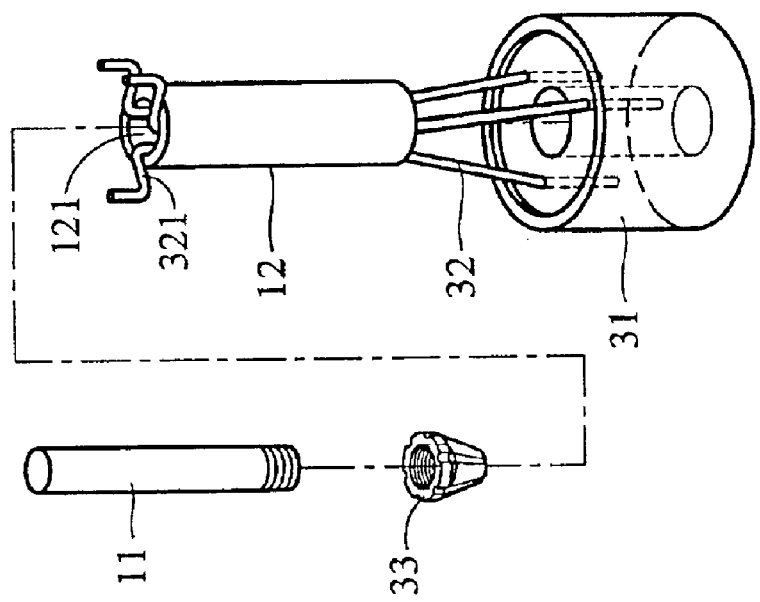
Figure 4B:
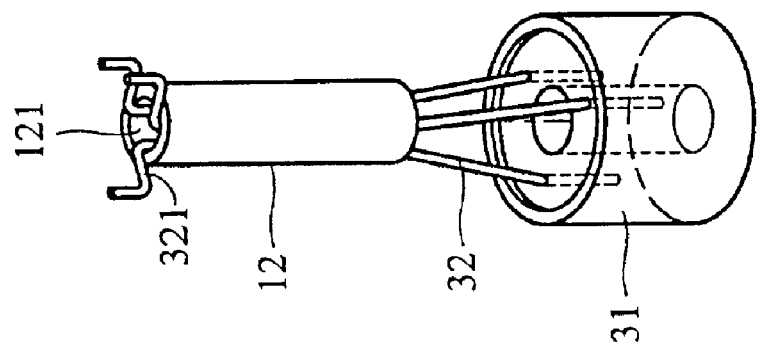
Figure 4A:
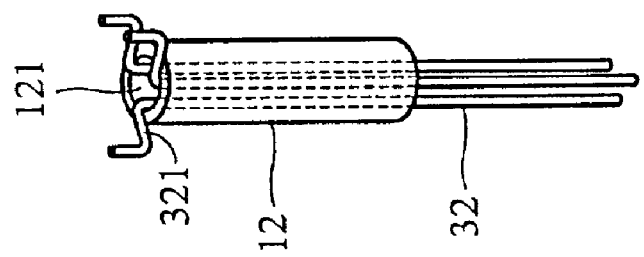
Figure 4F:
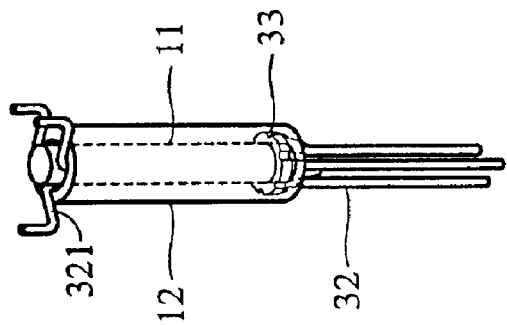
Figure 4E:
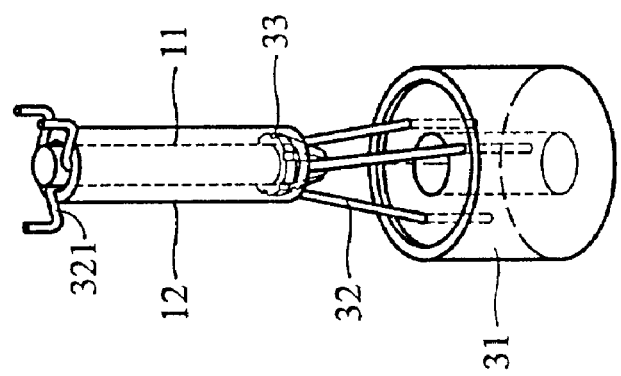
Figure 4D:
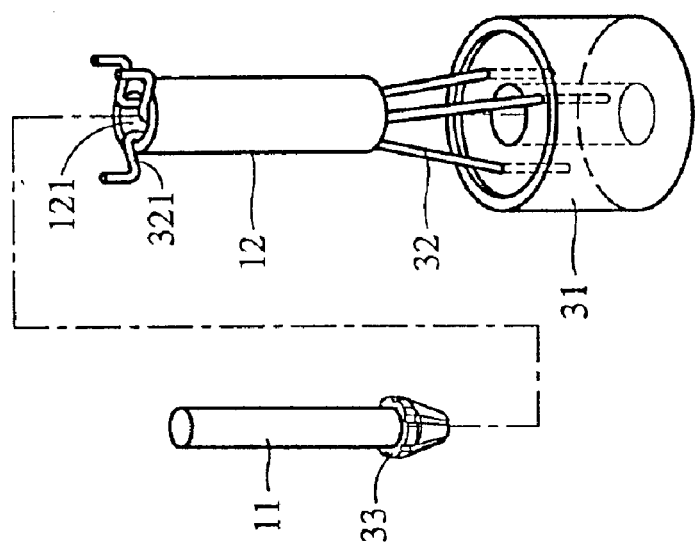

Referring to FIG. 4a, FIG. 4b, FIG. 4c, FIG. 4d, FIG. 4e, FIG. 4f and FIG. 4g, the assembly method comprises the following steps. First, as shown in FIG. 4a, the posts 32 are passed through the hollow portion 121 of the outer brush 12 in a manner such that the bending portion 321 of the posts 32 are located outside the hollow portion 121 of the outer brush 12. By such arrangement, the hollow portion 121 of the outer brush 12 is easily expanded by the posts 32. Then, the posts 32, passing through the hollow portion 121 of the outer brush 12, are disposed on the base 31 as shown in FIG. 4b. The guiding member 33 is connected with the brush core 11 through the threaded portion 332 as shown in FIG. 4c. Subsequently, as shown in FIG. 4d, FIG. 4e and FIG. 4f, the brush core 11, connecting with the guiding member 33, is passed through the hollow portion 121 of the outer brush 12 in a manner such that the brush core 11 is adjacent to the posts 32 after the guiding member 33 enters into the hollow portion 121 of the outer brush 12. At this time, the brush core 11 is held in one hand, and the posts 32 are expanded in the hollow portion 12 of the outer brush 12 by the other. Finally, as shown in FIG. 4g, the posts 32 are drawn out of the hollow portion 121 of the outer brush 12 so that the brush core 11 is adjacent to the outer brush 12 to complete the assembly of the post-CMP cleaning brush 10.

Furthermore, the posts 32 may be made of plastic steel so that the hollow portion 121 of the outer brush 12 can be actually expanded by the posts 32. In addition, since the material of the posts 32 are not the same as the outer brush 12, the posts 32 do not interfere with the outer brush 12 so as to damage the outer brush 12 when the posts 32 are drawn out of the hollow portion 121 of the outer brush 12.

In addition, the number of posts 32 is not limited to three as long as the posts 32 can actually assist in the assembly of the brush 10.

As stated above, by the assembly fixture and the method of this invention, the post-CMP cleaning brush can easily be assembled without damaging its outer brush.

While the invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above, and all equivalents thereto.

What is claimed is:

1. A fixture for assembling a post-CMP cleaning brush having a brush core and an outer brush, wherein the outer brush is provided with a hollow portion, and the fixture comprises:
   a base having a plurality of holes; and
   a plurality of posts inserted into the holes of the base through the hollow portion of the outer brush respectively so as to assist the brush core in passing through the hollow portion of the outer brush.

2. The fixture as claimed in claim 1, further comprising:
   a guiding member, connecting with the brush core, to assist the brush core in passing through the hollow portion of the outer brush.

3. The fixture as claimed in claim 2, wherein the guiding member is provided with a plurality of grooves corresponding to the posts respectively so that the guiding member slides along the posts by the grooves when the guiding member, connecting with the brush core, passes through the hollow portion of the outer brush.

4. The fixture as claimed in claim 2, wherein the guiding member is provided with a threaded portion for connecting with the brush core.

5. The fixture as claimed in claim 1, wherein each of the posts is provided with a bending portion.

6. The fixture as claimed in claim 1, wherein the base is provided with a concave portion.

7. A method for assembling a post-CMP cleaning brush comprising:
   (a) providing a post-CMP cleaning brush having a brush core and an outer brush, wherein the outer brush is provided with a hollow portion;

(b) providing a base, a plurality of posts and a guiding member;

(c) passing the posts through the hollow portion of the outer brush;

(d) disposing the posts, passing through the hollow portion of the outer brush, on the base;

(e) connecting the guiding member and the brush core;

(f) passing the brush core, connecting with the guiding member, through the hollow portion of the outer brush in a manner such that the brush core is adjacent to the posts after the guiding member enters into the hollow portion of the outer brush; and (g) drawing the posts out of the hollow portion of the outer brush so that the brush core is adjacent to the outer brush to complete the assembly of the post-CMP cleaning brush.

8. The method as claimed in claim 7, wherein the posts are made of plastic steel.

9. The method as claimed in claim 7, wherein the guiding member is provided with a plurality of grooves corresponding to the posts respectively so that the guiding member slides along the posts by the grooves when the guiding member, connecting with the brush core, passes through the hollow portion of the outer brush.

10. The method as claimed in claim 7, wherein the guiding member is provided with a threaded portion for connecting with the brush core.

11. The method as claimed in claim 7, wherein each of the posts is provided with a bending portion.

12. The method as claimed in claim 7, wherein the base is provided with a concave portion.

* * * * *